United States Patent [19]

Cuppens et al.

[11] Patent Number: 4,616,339

[45] Date of Patent: Oct. 7, 1986

[54] INTEGRATED CIRCUIT WITH IMPROVED PROGRAMMABLE READ-ONLY MEMORY

[75] Inventors: Roger Cuppens; Cornelis D. Hartgring, both of Eindhoven, Netherlands

[73] Assignee: U.S. Philips Corporation, New York, N.Y.

[21] Appl. No.: 618,006

[22] Filed: Jun. 6, 1984

[30] Foreign Application Priority Data

Feb. 3, 1984 [NL] Netherlands ................. 8400326

[51] Int. Cl.[4] .......................................... G11C 7/00
[52] U.S. Cl. .................................. 365/185; 365/189
[58] Field of Search ............... 365/182, 185, 189, 226, 365/230

[56] References Cited

U.S. PATENT DOCUMENTS 4,404,659  9/1983  Kihara et al. ................. 365/185
4,511,811  4/1985  Gupta ........................ 365/230 X Primary Examiner—Joseph A. Popek
Attorney, Agent, or Firm—Robert T. Mayer; Steven R. Biren

[57] ABSTRACT

Field effect transistors having a short channel length are desirable for carrying out logic operations at a high speed. However, they are then not capable of withstanding the comparatively high programming and erasing voltage at which an (E)EPROM has to be operated. During the programming cycle the field effect transistors are kept in the current-nonconducting state, while recording the logic information obtained by the logic operations, the "fast" transistors are nevertheless capable of withstanding the comparatively high voltage.

3 Claims, 7 Drawing Figures

INTEGRATED CIRCUIT WITH IMPROVED PROGRAMMABLE READ-ONLY MEMORY

BACKGROUND OF THE INVENTION

The invention relates to a logic memory circuit integrated on a semiconductor body and having at least one memory matrix of erasable programmable memory cells, which is controlled by a control unit constituted by transistors of the insulated gate field type (MOST's).

Programmable non-volatile memories of the EPROM (Erasable Programmable Read-Only Memory) and of the EEPROM (Electrically Erasable Programmable Read-Only Memory) type have recently become increasingly popular because they have the advantage of programming, erasing and reprogramming in a simple manner the memory unit in an electrical computer or microprocessor, as a result of which the flexibility for introducing new programs is considerably increased. Such an EPROM or EEPROM is then generally integrated on a semiconductor body, mostly together with further arithmetic and control units which forms part of the computer or microprocessor.

The programming of an EPROM or an EEPROM normally requires a considerably higher operating voltage than the voltage at which the remaining semiconductor elements on the semiconductor body are operated, i.e. a voltage immediately below the breakdown voltage of the semiconductor junctions operated in reverse direction (junction breakdown) of the semiconductor zones of which the EPROM or the EEPROM is composed. Background information on operating and programming voltages in an EEROM is contained in the article "Low-Voltage Single Supply CMOS Electrically Erasable Read-Only Memory", IEEE TRANSLATIONS ON ELECTRON DEVICES, Vol. ED-27, No. 7, July 1980.

In order to adapt the said remaining semiconductor elements, more particularly those required for selecting those cells of the memory to which the correct programming voltage has to be supplied, to the programming voltage of the memory, use could be made of field effect transistors having a comparatively large channel length. In fact, the larger the channel length, the higher becomes the source/drain breakdown voltage. Field effect transistors having a channel length of 10 $\mu$m are capable of withstanding, for example, a voltage between source electrode and drain electrode of 20 V, while with a channel length of 2.5 $\mu$m this voltage may fall below 10 V. The use of field effect transistors having a large channel length unfavorably influences the switching speed, however, which is undesirable.

SUMMARY OF THE INVENTION

The invention has for its object to provide an integrated memory circuit of the kind mentioned above, in which in spite of the necessity of the high programming voltage for programming the memory matrix nevertheless transistors having (in view of their breakdown voltage with respect to the programming voltage) a comparatively small channel length are used in order not to affect adversely its reading speed.

According to the invention, an integrated memory circuit of the kind mentioned above is characterized in that the control unit comprises programming means for supplying a programming voltage to the said memory matrix, which programming voltage is higher than the electrical breakdown voltage between the source and drain electrodes of a plurality of the field effect transistors in the current-conducting condition, but lower than this breakdown voltage in the current-nonconducting condition, and switching means for bringing and/or keeping field effect transistors in the control unit in the current-nonconducting condition while retaining their logic information.

According to the invention, the effect is utilized that the source/drain breakdown voltage of field effect transistors is considerably higher if such a field effect transistor is in the current-nonconducting condition than if it is current-conducting.

By this combination of measures, on the one hand a high reading speed is possible, while on the other hand the logic information, more particularly the selection and data information for a memory part of the field effect transistors, is retained despite the fact that these transistors are no longer current-conducting. Those transistors which are subjected to the high programming voltage of the memory should therefore be in the non-conducting condition during the programming cycle and should not change their logic information either. This requires an adapted writing/erasing logic and buffers for retaining the logic information during the programming cycle. When the programming voltage is applied, this information should be retained (for example in flip-flop circuits) as long as this comparatively high programming voltage is present. This condition has to be retained even when certain interference signals (address data and/or control signals) change during this cycle.

It will be clear from the foregoing that the invention described may also be used in non-volatile read/write memories (non-volatile RAM) because in such memories transistors of the programmable type are also utilized.

This method has, besides the use of faster circuits, the additional advantage that during the programming cycle the external bus (data or address bus) is free to operate any other circuits or to prepare the information for the next cycle.

BRIEF DESCRIPTION OF THE DRAWING

The invention will now be described, by way of example, with reference to the accompanying drawings, wherein:

FIGS. 1 to 4 correspond to FIGS. 5 to 8 of the prior non-prepublished Dutch Patent Application No. 83,04256 filed on Dec. 9th 1983. For a clear understanding of the invention, the logic circuit with EEPROM memory is first considered.

DESCRIPTION OF THE PREFERRED EMBODIMENTS

Figure 1:
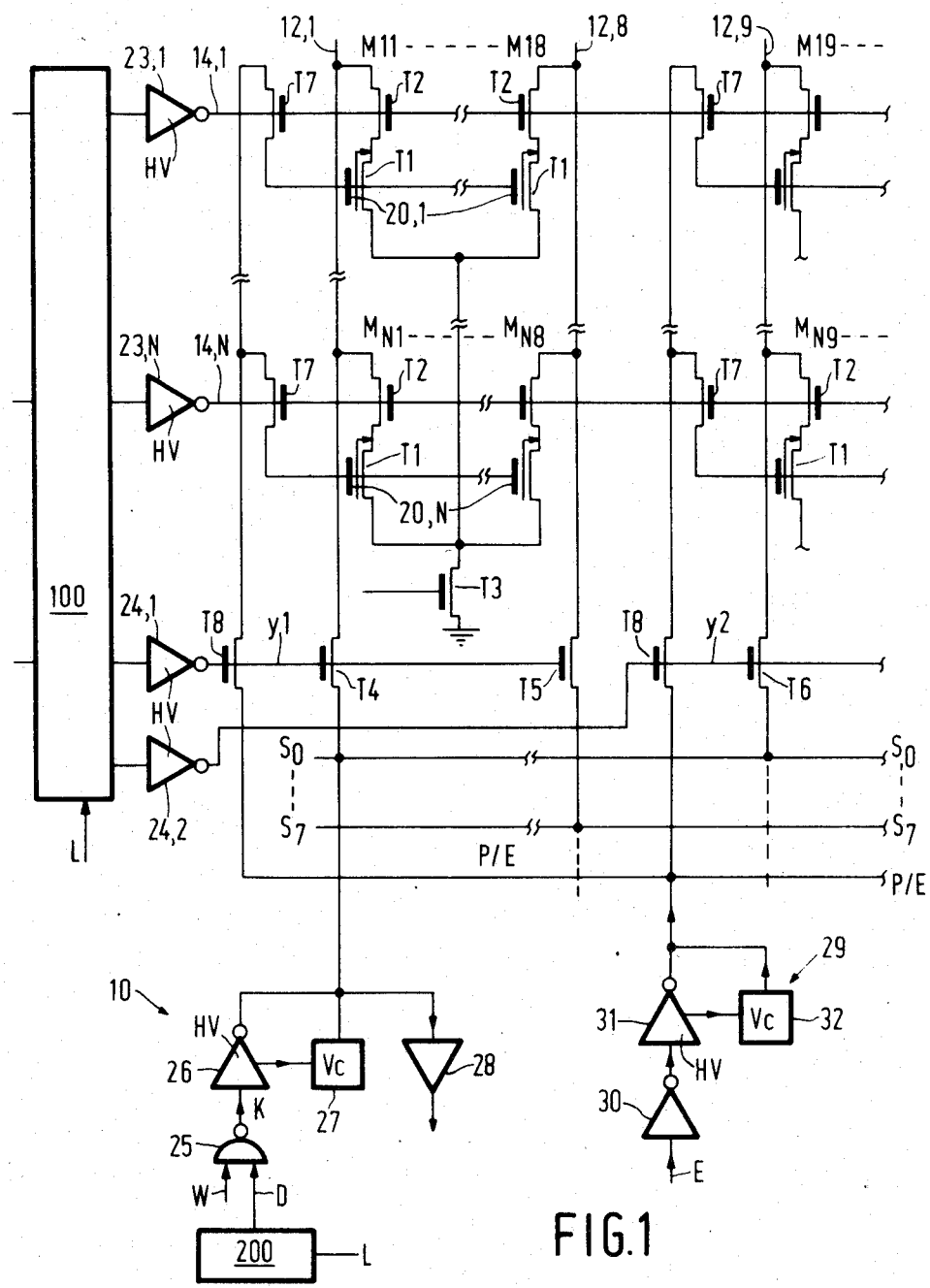
FIGS. 1 to 4 show the circuit diagram with associated voltage-time diagrams of an integrated circuit to which the invention can be applied.

FIG. 1 shows the circuit diagram of a part of a memory of the EEPROM type together with a part of the input/output electronics. The memory cells are grouped, by way of example, in words (bytes) of eight bits indicated by $M_{11} \ldots M_{18}, \ldots M_{N1} \ldots M_{N8}$ and $M_{19}...$, and $M_{N9}...$. Each memory cell comprises a memory transistor $T_1$, whose floating gate electrode is provided with an arrow as a symbol for the coupling of the floating gate to the drain zone of this transistor via the thin tunnel oxide. The drain zones of the memory transistors are connected to the selection transistors $T_2$, whose gates are connected to the word lines (14,1) ... (14,N) which are driven by inverters 23, whose outputs can be brought to a high voltage (HV). The construction of these inverters will be described hereinafter. The source zones of the transistors $T_1$ are connected in common to ground via the transistor $T_3$. By this transistor, a floating potential can be given to the source zones of the memory transistors.

The (vertical) bit lines $12,1...12,8$ and $12,9...$ are connected via the field effect transistors $T_4...T_5$, $T_6$ to the reading lines $S_o...S_7$. The gate electrodes of the transistors $T_4$, $T_5$ and $T_6...$, respectively, are connected to y selection lines $y_1$ and $y_2$, respectively, etc., which are each again driven by an inverter $24^1$ and $24^2$, respectively, etc.

The gate electrodes $20,1...20,N$, which are common to the cells of one byte, are connected via the transistors $T_7$, which are driven by the word lines 14, and $T_8$, which are driven by the lines $y_1, y_2$, to the line P/E.

The reading lines $S_o...S_7$ are connected to input-/output blocks 10, of which for the sake of clarity only the block 10 connected to the line $S_o$ is indicated in FIG. 1. The block 10 comprises as its input a NON-AND (NAND) gate 25, to the input of which can be supplied the writing signal W and the data D to be introduced. The output of the gate 25 is connected to an inverter 26, by means of which a high voltage HV can be supplied to the line $S_o$ and a control signal can be supplied to the block 27, which supplies a—low—reading voltage $V_c$ to $S_o$. The line $S_o$ is further connected to the input of a current detection circuit 28 for reading the stored information. The reading voltage generator 27 and the current detection amplifier 28 may be combined, if desired, to a common circuit.

The line P/E is connected to the block 29. This block comprises a first inverter 30, to the input of which the erasing signal E can be supplied. The output of the inverter 30 is connected to the input of a second inverter 31 by means of which a high voltage HV can be supplied to the line P/E. Moreover, the inverter 31 is connected to a voltage generator 32, by means of which, dependent upon the output signal supplied by the inverter 30, the reading voltage $V_c$ may be supplied to the line P/E.

The memories of the kind described herein are generally provided with a charge pump or voltage multiplier for generating the high voltage (of the order of 20 V) which is required for programming and/or erasing. This has the advantage for the user that the usual supply voltage of 5 V which is required to operate the normal C-MOS logic is sufficient. Therefore, for the inverters 23, 24, 26 and 31 special buffer stages are required which render it possible to pass from the normal logic voltage (0 and 5 V for C-MOS) to much higher programming voltages. These buffers must not or substantially not extract direct current from the charge pump.

Figure 2:
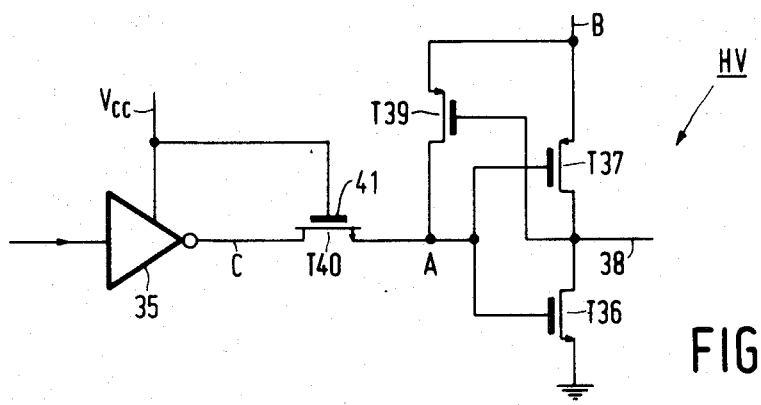

FIG. 2 shows the circuit diagram of a high-voltage buffer which can be used to pass from low to high voltage without direct current flowing. The buffer constructed according to the C-MOS technique is connected to an inverter 35 which is operated at a low supply voltage $V_{CC}$. The inverter 35 is a conventional C-MOS inverter comprising a p-channel transistor whose source is connected to the supply line $V_{CC}$ and an n-channel transistor whose source is connected to ground. The output C of the inverter 35 is connected to the input (point A) of an inverter comprising an n-channel transistor $T_{36}$ whose source is connected to ground and a p-channel transistor $T_{37}$ whose source is connected to the point B. The voltage which is applied to the point B may vary (FIG. 3) between $V_{CC}$ and $V_H$. The output signal may be derived at the output 38. Via the p-channel transistor $T_{39}$, the output 38 is fed back to the junction A in order to prevent direct current from flowing through the inverter 36,37 during operation. In order further to prevent current flow from point A (which is brought via the transistor $T_{39}$ to a high voltage $V_H$) via the inverter 35, there is connected between the point A and the output C of the inverter 35 an n-channel transistor $T_{40}$ whose gate electrode 41 is connected to $V_{CC}$.

Figure 3:
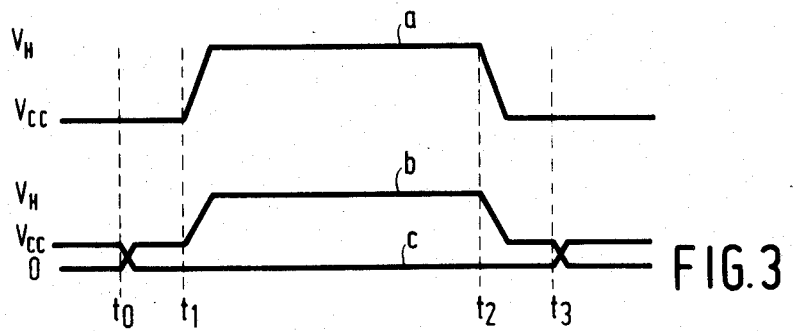

For further explanation of the operation of the buffer shown in FIG. 2, FIG. 3 shows a time diagram of voltages which can be applied to various points of the circuits. Curve a represents the voltage at point B; curve c represents the output voltage at the output C of the inverter 35. Curbe b represents the output voltage at the output 38. By way of example, in FIG. 3, starting from the situation in which the inverter 35 gives off a voltage $V_{CC}$ (logic "1") and the low supply voltage $V_{CC}$ is applied to point B. The transistor $T_{40}$ is cut off and point A is at the voltage $V_{CC}$ because $T_{39}$ is conducting (point 38 at zero Volt). At $t_o$ the output signal of the inverter 35 decreases to ground. Since the transistor $T_{40}$ becomes conducting, point A is also connected to ground (on the assumption that $T_{39}$, which is still conducting, is very small so that it has a high resistance), as a result of which $T_{36}$ becomes cut off and the p-channel transistor $T_{37}$ becomes conducting. The voltage at the output 38 increases to $V_{CC}$, as a result of which $T_{39}$ is cut off. At $t_1$ the voltage at point B increases from $V_{CC}$ to $V_H$ (for example 20 V). Via the conducting transistor $T_{37}$, the output 38 is charged to $V_H$. If subsequently (at $t_2$) $V_H$ decreases again to $V_{CC}$, the output voltage also decreases to $V_{CC}$. At $t_3$ the input signal of the inverter 35 decreases to 0 V, as a result of which the voltage at the output C of the inverter 35 increases to $V_{CC}$. The potential at the junction A increases to $V_{CC}-V_{TH}$, $V_{TH}$ representing the threshold voltage of $T_{40}$. The transistor $T_{37}$ is then cut off or cut off almost completely and the transistor $T_{36}$ becomes conducting so that the potential at the output 38 decreases, as a result of which the p-channel transistor $T_{39}$ becomes conducting and charges point A further to $V_{CC}$, while $T_{40}$ and $T_{37}$ are cut off completely. If now the voltage at the point B should be brought again to $V_H$ by the charge pump, point A is also charged to the value $V_H$ via the transistor $T_{39}$. The voltage difference $V_{gs}$ between the source of the transistor $T_{37}$ and the gate thus remains below the threshold voltage of this transistor so that this transistor does not become conducting. At the same time, the $V_{gs}$ of the transistor $T_{40}$ also remains below the threshold voltage so that no current can flow either via the transistors $T_{39}$ and $T_{40}$ from the point B to the inverter 35. In this manner, the feedback via the transistor $T_{39}$ prevents direct current from flowing through the buffer.

The inverters 23 and 24 can be composed of a buffer as shown in FIG. 2, in which case the inverter 35 can be replaced by NAND, NOR or other logic C-MOS blocks of the peripheral circuits.

Figure 4:
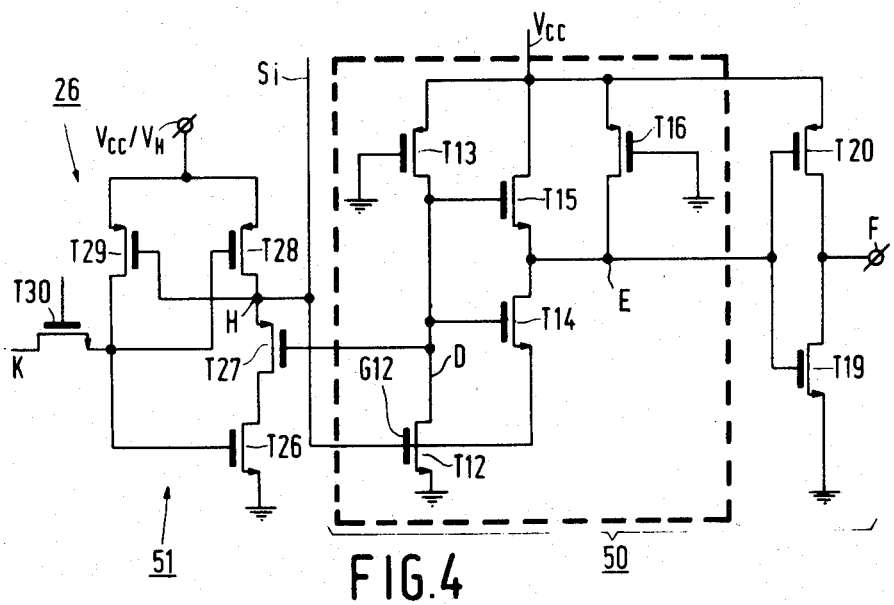

FIG. 4 shows the circuit diagram of the inverter 26 and of the reading voltage source 27 which in the present embodiment is combined with the detection circuit 28 to a constructional unit in the form of the block 50. The part of the block 50 which is surrounded by broken lines in FIG. 4 is of the same type as the reading amplifier described in the article "An 8 EEPROM Using the Simos Storage Cell" by B. Giebel, published in I.E.E.E. Journal of Solid State Circuits, Vol. SC-15, Nr. 3, June 1980, pp. 311/315, more particularly FIG. 6 and the associated description. The amplifier comprises an n-channel input transistor $T_{12}$ whose source zone is connected in ground and whose gate electrode $G_{12}$ is connected to one of the lines $S_o \ldots S_7$. The drain of $T_{12}$ is connected via the load transistor $T_{13}$ to the supply line $V_{CC}$. In this case, $T_{13}$ is a p-channel transistor, but it should be appreciated that $T_{13}$ may alternatively be an n-channel transistor, as is the case in the aforementioned publication, or a resistor. The gate electrode of $T_{13}$ is connected to a fixed voltage. The output D of the amplifier (inverter) $T_{12}$, $T_{13}$ is connected to the gate electrodes of two series-connected n-channel transistors $T_{14}$, $T_{15}$. The source of $T_{14}$ is connected to the gate $G_{12}$ of $T_{12}$, while the drain of $T_{14}$ is connected to the source of $T_{15}$. The drain $T_{15}$ is connected to the supply line $V_{CC}$. The junction E between $T_{14}$ and $T_{15}$ is connected to the drain of the transistor $T_{16}$ connected as a resistor, whose gate is connected to a fixed potential and whose source is connected to the supply line $V_{CC}$. Instead of he p-channel transistor $T_{16}$ used here, it is alternatively possible, as in the aforementioned publication, to use an n-channel transistor whose gate is connected to $V_{CC}$.

To understand the operation of the circuit comprising the transistors $T_{12}$–$T_{16}$ reference may be made to the publication of B. Giebel. In principle, the operation is based on the fact that, when the cell to be read out is in a non-conducting condition, such a low current is required that the latter can be entirely supplied to $T_{16}$ without causing a significant voltage drop between the source and drain of transistor $T_{16}$ and is passed via $T_{14}$ to the connected line $S_i$. In case the cell to be read out is conducting and requires a high current, an associated decrease in the voltage at the gate $G_{12}$ will be inverted and will be passed via the connection D to the gate of $T_{15}$, as a result of which this transistor becomes conducting. The extra current required to keep the voltage at the gate $G_{12}$ and at the connected line $S_i$ constant at a desired voltage $V_C$ (determined by the size of the various transistors) can be supplied by $T_{15}$.

The voltage variation occurring at the junction E can be detected by the inverter stage $T_{19}$, $T_{20}$ comprising an n-channel transistor $T_{19}$ whose source is connected to ground (negative supply line) and a p-channel transistor $T_{20}$ whose source is connected to the positive supply line $V+$. The drain zones of the transistors $T_{19}$ and $T_{20}$ are connected to the output F at which the output signal can be derived.

The buffers (inverters) 26 and 31 of FIG. 1 are indicated in FIG. 4 by the circuit 51. This buffer differs from the output stage of the buffer shown in FIG. 2 in that in this case the p-channel transistor $T_{27}$ is inserted between the output and the n-channel transistor $T_{26}$. This transistor has to ensure that, when the control signal K which is supplied via $T_{30}$ amounts to 5 V, the output H of the buffer, which is connected to the line $S_i$, is not discharged to 0 V. In fact, when the output H is discharged to such an extent that $V_g$ of $T_{27}$ is smaller than its threshold voltage, $T_{27}$ is cut off and the voltage at the output H is determined by the block 50.

Figure 5:
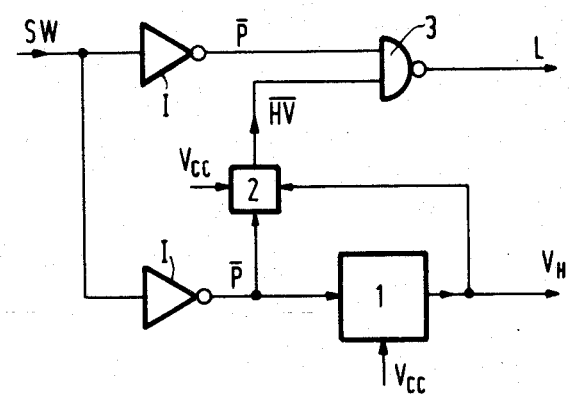
FIG. 5 shows the circuit diagram of the invention.
Figure 6:
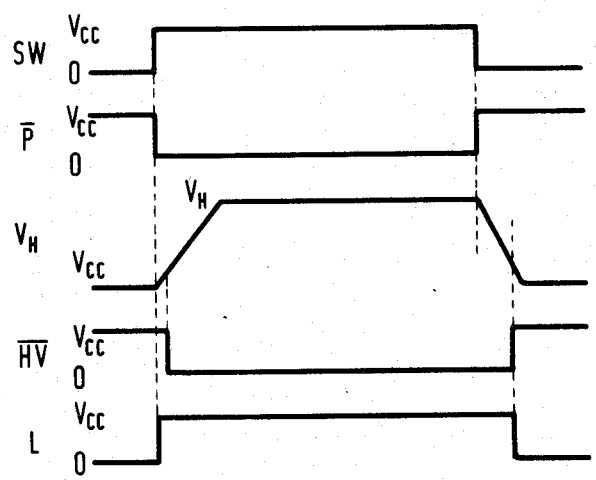
FIG. 6 shows the associated voltage-time diagrams with which the invention is realized.

FIG. 5 shows diagrammatically the circuit of a part of the control unit determining the writing/erasing cycle and FIG. 6 shows the wave forms of the main signals. In these Figures, SW denotes the signal which indicates when the programming cycle (writing or erasing cycle) starts and how long this cycle lasts (SW="1" means programming). $V_H$ is the high-voltage supply line and L is the control signal for bringing or keeping field effect transistors in the control unit of the memory in the current-nonconducting condition and for retaining the logic information present (L="1" means that the information is retained). The block 1 comprises the high-voltage generator (in the form of a generally-known charge pump) together with the switch which connects $V_H$ and $V_{CC}$ when the signal SW=0. The generator and the switch are controlled by the $\overline{P}$-signal ($\overline{P}$="0" means pump active, switch open). The block 2 represents a detector circuit which gives off a signal $\overline{HV}$="0" when the voltage at the $V_H$ line is higher than the supply voltage $V_{CC}$. It clearly appears from the waveforms (FIG. 6) that as long as $\overline{HV}$ is "low" (0), the logic information has to be retained (L="1") because no switching actions are allowed to take place as long as the high voltage is present in the memory. The two inverters I in this circuit diagram may be replaced, if desired, by several logic gates and/or inverters so that delays in the remaining part of the circuit can be compensated for or other signals can participate in the operation of this control part.

Via the NAND gate 3, by $\overline{P}$ and $\overline{HV}$ the signal L is produced, thus preventing a transistor in the high-voltage part from switching when a high voltage is present. However, this is not possible in the blocks 1 and 2 themselves (FIG. 5). Since the increase and the decrease of the high voltage have to take place at a fairly low rate, no high switching speeds are required in this case and the channel length of the transistors can be made larger. Furthermore, in this case the high voltage can be distributed over several MOS transistors (cascade arrangement of MOST's) so that each transistor has a smaller source/drain voltage. An example is given in FIG. 7 in which a circuit diagram for the detection circuit 70 (block 2 in FIG. 5) is illustrated.

Thus, it is apparent from the above description how, during the programming cycle, simultaneously the programming signal $V_H$ (FIG. 4) is supplied to the memory transistors $T_1$ (FIG. 1) and it is ensured that the logic information in the buffer (FIG. 2) is retained in spite of the fact that the relevant transistors in this buffer are brought into the current-nonconducting condition. The control signal L is supplied for this purpose to address buffer circuits 100, which, upon receipt of an address, control via address decoder circuits the high-voltage buffers HV (FIGS. 1 and 2). The signal L now prevents the passage of any internal change of address to the output stage $T_{36}$ and $T_{37}$ (FIG. 2) so that the latter is current-nonconducting and remains in this condition as long as the programming voltage is present. Similarly, the signal L is supplied to data input buffer circuits 200 which supply the data to the data input D of the NAND gate 25 (FIG. 1). As long as the signal L is present, no data changes will be supplied to the NAND gate 25, which results in that the output stage of the inverters 26 is current-nonconducting and remains in this condition. Such controlled address and data input buffer circuits are known per se (address and data latch buffers) and therefore need not be described further.

Figure 7:
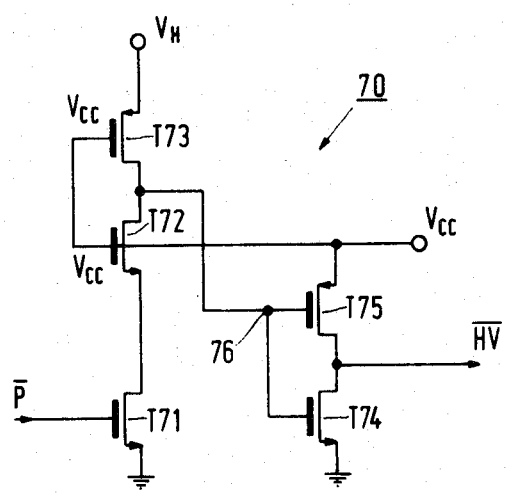
FIG. 7 shows a circuit for detecting the presence of the programming voltage.

The detection circuit 70 shown in FIG. 7 comprises a series arrangement of two N-MOS transistors $T_{71}$ and $T_{72}$ and of a P-MOS transistors $T_{73}$, the source electrode of the latter transistor being connected to the high-voltage supply track $V_H$. The gate electrode of $T_{73}$ is connected to the gate electrode of $T_{72}$, which is connected to the supply voltage line $V_{CC}$. The gate electrode of the transistor $T_{71}$ receives the inverted writing/erasing signal $\overline{P}$ ($=\overline{SW}$). As long as the signal $\overline{P}$ is "high" (1), $T_{71}$ and $T_{72}$ will be conducting and $T_{73}$ is cut off because the potential at the line $V_H$ is equal to $V_{CC}$ (the line $V_H$ is connected thereto via the switch controlled by the signal $\overline{P}$ and the charge pump is inactive), just like the potential at its gate electrode. The input 76 of the C-MOS inverter constituted by transistors $T_{74}$ and $T_{75}$ receives a "low" (0) signal so that the output signal $\overline{HV}$ will be "high" (1).

When the signal $\overline{P}$ passes to "low" (0), which means that the charge pump (block 1, FIG. 5) is switched on, $T_{71}$ will be cut off. The potential at the line $V_H$ will now increase so that $T_{73}$ will become conducting when the potential at the line $V_H$ exceeds the value $V_{CC}+|V_{TP}|$ ($V_{TP}$ is the threshold voltage of $T_{73}$). The "high" signal then occurring at the input 76 is inverted by the inverter $T_{74}$-$T_{75}$ and the latter supplies the "low" signal $\overline{HV}$ to the NAND gate 3 of FIG. 5. It should be noted that, as soon as the junction between $T_{72}$ and $T_{71}$ is charged above the potential $V_{CC}-|V_{TN}|$, the transistor $T_{72}$ no longer conducts current ($V_{TN}$ is the threshold voltage of $T_{72}$). After termination of the programming cycle, the signal SW passes to "0" and $\overline{P}$ passes to "1" so that the charge pump (block 1, FIG. 5) will be stopped. The high voltage at the conductor $V_H$ will decrease (FIG. 6) by discharge of the conductor $V_H$ via the said switch in the form of a transistor which is controlled by the signal $\overline{P}$ and which connects the conductor $V_H$ to the potential $V_{CC}$.

As soon as the signal $\overline{P}$ is "high" ("1"), $T_{71}$ and hence also $T_{72}$ will become conducting. Since $T_{73}$ is still conducting, discharge of the conductor $V_H$ will also take place via $T_{73}$, $T_{72}$ and $T_{71}$. Now the width/length ratio of the transistor $T_{73}$ is chosen considerably larger than the resulting width/length ratio of the series arrangement of $T_{71}$ and $T_{72}$ so that the potential at the point 76 is not essentially lower than the potential at $V_H$. Therefore, the point 76 will continue to convey a "high" signal and $\overline{HV}$ remains "low".

As soon as the voltage at the conductor $V_H$ has decreased to about $V_{CC}+|V_{TP}|$ the potential at the point 76 has decreased because of the voltage division over $T_{73}$ on the one hand and $T_{71}$ and $T_{72}$ on the other hand to such an extent that the inverter $T_{74}$, $T_{75}$ switches and the signal $\overline{HV}$ again becomes "high" ("1"). It is not until then that the L-signal will become "low" again and will admit again address and data changes (for reading cycles) to the memory. The voltage at $V_H$ then has already fallen below the breakdown voltage of the transistors (in the conducting condition). The voltage at $V_H$ will now decrease further to $V_{CC}$, $T_{73}$ passing to the cut-off condition as soon as the voltage at $V_H$ falls below $V_{CC}+|V_{TP}|$.

Although in the preceding examples a memory circuit comprising complementary transistors has been described, the principle of the invention may also be applied in a memory circuit which is provided with transistors of only one conductivity type.

What is claimed is:

1. An integrated logic memory circuit which comprises a semiconductor body and at least one memory matrix of erasable programmable memory cells, a control unit having transistors of the insulated gate field effect type (MOST's) and capable of assuming a current-conducting condition and a current-nonconducting condition and comprising programming means for supplying a programming voltage to said memory matrix, said programming voltage being higher than the breakdown voltage between the source and drain electrodes of a plurality of the field effect transistors in the current-conducting condition, but lower than said breakdown voltage in the current-nonconducting condition, and switching means for maintaining the field effect transistors in the control unit in the current-nonconducting condition while recording logic information.

2. An integrated memory circuit as claimed in claim 1, in which the control unit comprises a selection unit for performing logic operations, which selects the correct cells of the memory for supplying the programming voltage, characterized in that during the cycle in which the programming means supply the programming voltage to a selected memory cell, the switching means keeps transistors of the selection unit in the current-nonconducting condition, the selection unit further comprising means for retaining the logic information present while its transistors are in the current-nonconducting condition.

3. An integrated memory circuit as claimed in claim 1 or 2, characterized in that the memory circuit comprises complementary insulated gate field effect transistors.

* * * * *